US011579208B2

(12) United States Patent
Wang et al.

(10) Patent No.: US 11,579,208 B2
(45) Date of Patent: Feb. 14, 2023

(54) METHOD, APPARATUS AND DEVICE FOR EVALUATING THE STATE OF A DISTRIBUTION TRANSFORMER, AND A MEDIUM AND A PROGRAM

(71) Applicant: Siemens Aktiengesellschaft, Munich (DE)

(72) Inventors: Dan Wang, Beijing (CN); Jing Li, Beijing (CN); Hao Liu, Beijing (CN); Wen Tao Hua, Beijing (CN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/277,418

(22) PCT Filed: Sep. 20, 2019

(86) PCT No.: PCT/EP2019/075335
§ 371 (c)(1),
(2) Date: Mar. 18, 2021

(87) PCT Pub. No.: WO2020/058479
PCT Pub. Date: Mar. 26, 2020

(65) Prior Publication Data
US 2021/0349161 A1 Nov. 11, 2021

(30) Foreign Application Priority Data
Sep. 20, 2018 (CN) .......................... 201811103216.5

(51) Int. Cl.
*G01R 31/62* (2020.01)
*G06K 9/62* (2022.01)
(52) U.S. Cl.
CPC ........... *G01R 31/62* (2020.01); *G06K 9/6218* (2013.01)
(58) Field of Classification Search
CPC ............................. G06Q 50/06; H02J 2203/20
See application file for complete search history.

(56) References Cited

U.S. PATENT DOCUMENTS

2009/0273336 A1* 11/2009 Wolfe .................... G01R 31/42
703/18
2010/0001700 A1* 1/2010 Santos .................. H02J 3/1878
323/256

(Continued)

FOREIGN PATENT DOCUMENTS

DE 102011120321 B3 6/2012

OTHER PUBLICATIONS

Zihuan Lian et al: "Smart asset management of aging devices in energy systems: A case study of transformers"; 2011 2nd IEEE pes International Conference and Exhibition on Innoative Smart Grid Technologies; Manchester, United Kingdom; Dec. 5, 2011; pp. 1-6.
(Continued)

*Primary Examiner* — Fabricio R Murillo Garcia
(74) *Attorney, Agent, or Firm* — Harness, Dickey & Pierce, P.L.C.

(57) ABSTRACT

The present application provides a method and apparatus for evaluating the health state of a distribution transformer, and a medium and a program. In an embodiment, the method for evaluating the health state of a distribution transformer includes: extracting features from electric power parameters of a plurality of distribution transformers; clustering the plurality of distribution transformers into M subsets based on the extracted features, M being a natural number greater than 1 and less than a number of the distribution transformers; and respectively executing processing for each of the M subsets. In an embodiment, the processing includes determining a cluster center of the subset as a reference transformer for the subset; calculating the similarity between each of the distribution transformers in the subset and the reference transformer therein; and sorting the distribution transformers in the subset according to the calculated similarity.

14 Claims, 3 Drawing Sheets

(56) References Cited

U.S. PATENT DOCUMENTS

| | | | | |
|---|---|---|---|---|
| 2015/0052088 A1* | 2/2015 | Arya | ............... | H02J 3/00 |
| | | | | 706/12 |
| 2019/0042954 A2* | 2/2019 | Li | ............... | H02J 13/00002 |
| 2019/0383864 A1* | 12/2019 | Joshi | ............... | H02J 3/00 |

OTHER PUBLICATIONS

International Search Report PCT/ISA/210 for International Application No. PCT/EP2019/075335 dated Dec. 16, 2019.
Written Opinion PCT/ISA/237 for International Application No. PCT/EP2019/075335 dated Dec. 16, 2019.
Zijuan, L.et al., "Smart asset management of aging devices in energy systems: A case study of transformers," 2011 2nd IEEE PES International Conference and Exhibition on Innovative Smart Grid Technologies, pp. 1-6, Dec. 5, 2011.
Mominul, I. et al., "A nearest neighbour clustering approach for incipient fault diagnosis of power transformers," Electrical Engineering, vol. 99, No. 3, pp. 1109-1119, Nov. 16, 2016.
Zhao, F., Fault diagnosis of transformer based on cluster analysis, Power Engineering and Automation Conference, pp. 77-81, Sep. 8, 2011.
Abu-Elanien, AEB et al., "Asset management techniques for transformers," Electric Power Systems Research, vol. 80, No. 4, pp. 456-464, Apr. 30, 2010.
Li, Y. et al., "Fuzzy Evaluation Algorithm of Distribution Transformer Based on Adaptive Variable Weight," International Journal of Control and Automation, vol. 10, No. 8, pp. 65-80, Aug. 31, 2017.

\* cited by examiner

METHOD, APPARATUS AND DEVICE FOR EVALUATING THE STATE OF A DISTRIBUTION TRANSFORMER, AND A MEDIUM AND A PROGRAM

PRIORITY STATEMENT

This application is the national phase under 35 U.S.C. § 371 of PCT International Application No. PCT/CN2019/075335 which has an International filing date of Sep. 20, 2019, which designated the United States of America and which claims priority to Chinese patent application CN 201811103216.5 filed Sep. 20, 2018, the entire contents of each of which are hereby incorporated herein by reference.

FIELD

Embodiments of the present invention generally relate to the field of transformers, and in particular relate to a method, apparatus, device for evaluating the state of a distribution transformer, and a medium and a program.

BACKGROUND ART

The health of a distribution transformer can be understood as being high in reliability and low in electric power loss. However, it is difficult to give a clear definition of how to evaluate the health state of a distribution transformer.

At present, the evaluation of transformer health mainly focuses on the state monitoring and maintenance of a high voltage transformer and the evaluation of device reliability, and a plurality of transformer state evaluation methods have been proposed. However, these methods are all based on fault or event data, or internal monitoring data of a transformer, and these methods are based on a single device.

SUMMARY

The brief summary of the present invention is given below to provide a basic understanding of some aspects and embodiments of the present invention. It should be understood that the summary is not an exhaustive summary of the present invention. The summary is neither intended to determine the key or important part of the present invention, nor to limit the scope of the present invention. The object thereof is merely to give some concepts in a simplified form, as a prelude to the more detailed description presented later.

In view of the foregoing, embodiments of the present invention provide a method and apparatus for evaluating the health state of a distribution transformer.

According to one embodiment of the present invention, a method for evaluating the health state of a distribution transformer is provided, comprising: extracting features from electric power parameters of a plurality of distribution transformers; clustering the plurality of distribution transformers into M subsets based on the extracted features, where M is a natural number greater than 1 and less than the number of the distribution transformers; and respectively executing the following processing for each of the M subsets: determining a cluster center of the subset as a reference transformer for the subset; calculating the similarity between each of the distribution transformers in the subset and the reference transformer; and sorting the distribution transformers in the subset according to the calculated similarity.

According to another embodiment of the present invention, an apparatus for evaluating the health state of a distribution transformer is provided, comprising: a feature extraction unit configured to extract features from electric power parameters of a plurality of distribution transformers; a clustering unit configured to cluster the plurality of distribution transformers into M subsets based on the extracted features, where M is a natural number greater than 1 and less than the number of the distribution transformers; and a reference determination unit configured to determine a cluster center of each of the subsets as a reference transformer for the subset; a similarity calculation unit configured to calculate the similarity between each of the distribution transformers in each of the subsets and the reference transformer in the subset; and a sorting unit configured to sort the distribution transformers in each of the subsets according to the calculated similarity.

According to another embodiment of the present invention, an electronic device is provided, comprising: at least one processor; and a memory coupled to the at least one processor and used for storing instructions that, when executed by the at least one processor, cause the processor to execute the method of an embodiment, for evaluating the health state of a distribution transformer as described above.

According to another embodiment of the present invention, a non-transitory machine readable storage medium is provided, which stores an executable instruction that, when executed, causes a machine to execute the method of an embodiment for evaluating the health state of a distribution transformer as described above.

According to another embodiment of the present invention, a computer program is provided, comprising a computer executable instruction that, when executed, causes at least one processor to execute the method of an embodiment for evaluating the health state of a distribution transformer as described above.

According to another of an embodiment of the present invention, a computer program product is provided, which is tangibly stored in a computer readable medium and comprises a computer executable instruction that, when executed, causes at least one processor to execute the method of an embodiment for evaluating the health state of a distribution transformer as described above.

BRIEF DESCRIPTION OF THE DRAWINGS

The essence and advantages of the present disclosure can be further understood with reference to the following drawings. In the drawings, similar assemblies or features may have the same reference numerals.

REFERENCE SIGNS

Figure 1:
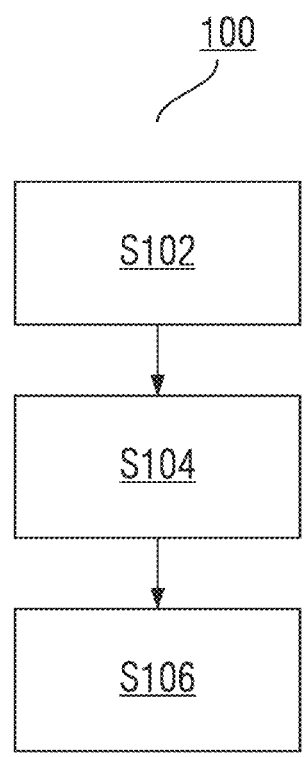
FIG. 1 is a flow chart of an example process of a method for evaluating the health state of a distribution transformer according to one embodiment of the present invention.

100: Method for evaluating the health state of a distribution transformer
S102-S106: Step
200: Apparatus for evaluating the health state of a distribution transformer
202: Feature extraction unit
204: Clustering unit

206: Reference determination unit
208: Similarity calculation unit
210: Sorting unit
212: State evaluation unit
300: Electronic device
302: At least one processor
304: Memory

DETAILED DESCRIPTION OF THE EXAMPLE EMBODIMENTS

According to one embodiment of the present invention, a method for evaluating the health state of a distribution transformer is provided, comprising: extracting features from electric power parameters of a plurality of distribution transformers; clustering the plurality of distribution transformers into M subsets based on the extracted features, where M is a natural number greater than 1 and less than the number of the distribution transformers; and respectively executing the following processing for each of the M subsets: determining a cluster center of the subset as a reference transformer for the subset; calculating the similarity between each of the distribution transformers in the subset and the reference transformer; and sorting the distribution transformers in the subset according to the calculated similarity.

In this way, it is possible in at least one embodiment, to evaluate the health states of a large number of distribution transformers and sort the health levels thereof, such that an operator can focus on a set of specific transformers having a predetermined health level. The method according to the embodiments of the present invention has a quicker speed and a higher efficiency, and can save on costs.

Optionally, in one example of the above-described embodiment, the electric power parameter is a voltage.

Optionally, in one example of the above-described embodiment, extracting features from electric power parameters of a plurality of distribution transformers comprises: extracting the features based on statistical parameters, and filtering the electric power parameters to obtain the filtered features.

In this way, a large number of different features can be extracted, such that the distribution transformers can be better clustered.

Optionally, in one example of the above-described embodiment, calculating the similarity between each of the distribution transformers in the subset and the reference transformer comprises: calculating a cosine distance or a Euclidean distance between an electric power parameter curve of a distribution transformer and an electric power parameter curve of the reference transformer.

In this way, in at least one embodiment, the similarity between a distribution transformer and the reference transformer can be calculated by using different modes as needed.

Optionally, in one example of the above-described embodiment, the processing executed for each of the M subsets further comprises: evaluating the state of each distribution transformer based on the health state of the reference transformer in one subset and the sorting of the distribution transformers therein.

In this way, the state of each distribution transformer can be evaluated.

According to another embodiment of the present invention, an apparatus for evaluating the health state of a distribution transformer is provided, comprising: a feature extraction unit configured to extract features from electric power parameters of a plurality of distribution transformers; a clustering unit configured to cluster the plurality of distribution transformers into M subsets based on the extracted features, where M is a natural number greater than 1 and less than the number of the distribution transformers; and a reference determination unit configured to determine a cluster center of each of the subsets as a reference transformer for the subset; a similarity calculation unit configured to calculate the similarity between each of the distribution transformers in each of the subsets and the reference transformer in the subset; and a sorting unit configured to sort the distribution transformers in each of the subsets according to the calculated similarity.

In this way, it is possible in at least one embodiment, to evaluate the health states of a large number of distribution transformers and sort the health levels thereof, such that an operator can focus on a set of specific transformers having a predetermined health level. The method according to the embodiments of the present invention has a quicker speed and a higher efficiency, and can save on costs.

Optionally, in one example of the above-described embodiment, the electric power parameter is a voltage.

Optionally, in one example of the above-described embodiment, the feature extraction unit is further configured to extract the features based on statistical parameters, and to filter the electric power parameters to obtain the filtered features.

In this way, in at least one embodiment, a large number of different features can be extracted, such that the distribution transformers can be better clustered.

Optionally, in one example of the above-described embodiment, the similarity calculation unit is further configured to calculate a cosine distance or a Euclidean distance between an electric power parameter curve of a distribution transformer and an electric power parameter curve of the reference transformer.

In this way, in at least one embodiment, the similarity between a distribution transformer and the reference transformer can be calculated by using different modes as needed.

Optionally, in one example of the above-described embodiment, the apparatus for evaluating the health state of a distribution transformer further comprises: a state evaluation unit configured to evaluate the health state of each distribution transformer based on the health state of the reference transformer in one subset and the sorting of the distribution transformers therein.

According to another embodiment of the present invention, an electronic device is provided, comprising: at least one processor; and a memory coupled to the at least one processor and used for storing instructions that, when executed by the at least one processor, cause the processor to execute the method of an embodiment, for evaluating the health state of a distribution transformer as described above.

In this way, in at least one embodiment, the health state of each distribution transformer can be evaluated.

According to another embodiment of the present invention, a non-transitory machine readable storage medium is provided, which stores an executable instruction that, when executed, causes a machine to execute the method of an embodiment for evaluating the health state of a distribution transformer as described above.

According to another embodiment of the present invention, a computer program is provided, comprising a computer executable instruction that, when executed, causes at least one processor to execute the method of an embodiment for evaluating the health state of a distribution transformer as described above.

According to another of an embodiment of the present invention, a computer program product is provided, which is tangibly stored in a computer readable medium and comprises a computer executable instruction that, when executed, causes at least one processor to execute the method of an embodiment for evaluating the health state of a distribution transformer as described above.

The subject matter described herein will now be discussed with reference to example embodiments. It should be understood that the discussion of the embodiments is merely intended to enable a person skilled in the art to better understand and realize the subject matter described herein, but not to limit the protection scope, applicability or examples set forth in the claims. The functions and arrangement of the discussed elements can be changed without departing from the protection scope of the present disclosure. Various processes or assemblies can be omitted, replaced or added in various examples as needed. For example, the described method can be executed in an order different from the described order, and the steps can be added, omitted or combined. In addition, the features described in relation to some examples can also be combined in other examples.

As used herein, the term "comprise" and the variations thereof denote an open term, which means "include but not limited to". The term "based on" denotes "at least partially based on". The terms "one embodiment" and "an embodiment" denote "at least one embodiment". The term "other embodiment" denotes "at least one other embodiment". The terms "first", "second" and the like can refer to different or the same objects. Other definitions, whether explicit or implicit, may be included below. Unless explicitly specified in the context, the definition of a term is consistent throughout the description.

An embodiment of the present invention provides a method and apparatus for evaluating the health state of a distribution transformer. The method according to one embodiment of the present invention comprises: collecting historical electric power parameter data of a large number of distribution transformers, extracting different features from the data, clustering the plurality of distribution transformers according to the extracted features to obtain a plurality of subsets, determining a cluster center of each of the subsets as a reference, and then comparing the other distribution transformers in the subset with the reference to evaluate the states of the distribution transformers.

The method and apparatus for evaluating the health state of a distribution transformer according to the embodiments of the present invention are described in detail below in combination with the drawings.

FIG. 1 is a flow chart of an example process of a method 100 for evaluating the health state of a distribution transformer according to one embodiment of the present invention.

As shown in FIG. 1, firstly, in block S102, features are extracted from electric power parameters of a plurality of distribution transformers.

Preferably, the electric power parameter is a voltage. In the method according to one embodiment of the present invention, historical voltage data of a large number of distribution transformers are collected, and different features are extracted from the voltage data. Specifically, the features can be extracted based on statistical parameters, and the electric power parameters can also be filtered to obtain the filtered and noise-reduced features.

A person skilled in the art can understand that the statistical parameters may comprise: a mean value, a minimum value, a maximum value, a standard deviation, various percentiles, a moment, kurtosis, etc., which will not be described again herein.

After the features are extracted as stated above, in block S104, the plurality of distribution transformers are clustered into M subsets based on the extracted features. It can be understood that M is a natural number greater than 1 and less than the number of the distribution transformers.

Herein, clustering can be performed by using common clustering algorithms such as K-Means and K-Medoids, and the clustering algorithm is not limited in the present invention. A person skilled in the art can understand the specific process of clustering a plurality of distribution transformers into M subsets, which will not be described again herein.

Next, in block S106, the following processing is respectively performed for each of the M subsets.

Firstly, a cluster center of the subset is determined as a reference transformer for the subset.

A person skilled in the art can understand that the cluster center of each of the subsets can be determined in the process of performing clustering by using a clustering algorithm to obtain the M subsets. The cluster center determined by means of certain clustering algorithms may not be from a distribution transformer; in such a situation, the distribution transformer closest to the determined cluster center can be determined as the reference transformer, which will not be described again herein.

Then, the similarity between each of the distribution transformers in the subset and the reference transformer therein is calculated. Specifically, for example, the similarity between a distribution transformer and the reference transformer can be calculated by calculating a cosine distance or a Euclidean distance between a voltage curve of the distribution transformer and a voltage curve of the reference transformer.

Finally, according to the calculated similarity between each of the distribution transformers and the reference transformer, the distribution transformers are sorted.

In one example, the processing executed for each of the M subsets may further comprise: evaluating the health state of each of the distribution transformers according to the health state of the reference transformer in one subset and the sorting of the distribution transformers therein.

A person skilled in the art can understand that the reference transformer obtained by means of clustering may be a reference for healthy distribution transformers, and may also be a reference for unhealthy transformers. In terms of the reference for healthy distribution transformers, the higher the similarity between a distribution transformer and the reference, the better the health state of the distribution transformer; however, in terms of the reference for unhealthy transformers, the higher the similarity between a distribution transformer and the reference, the worse the health state of the distribution transformer. In practical applications, a person skilled in the art can determine, based on experience or according to, for example, a voltage curve of a reference transformer, whether the reference transformer is a healthy reference or an unhealthy reference so as to evaluate the state of each of the distribution transformers based on the health state of the reference transformer and the sorting of the distribution transformers.

The method for evaluating the health state of a distribution transformer according to one embodiment of the present invention can sort the health levels of a large number of distribution transformers, and can further evaluate the health states thereof, such that an operator can pay attention to a set of specific transformers having a predetermined health level as needed. The method according to the embodiments of the present invention has a quicker speed and a higher efficiency, and can save on costs.

Figure 2:
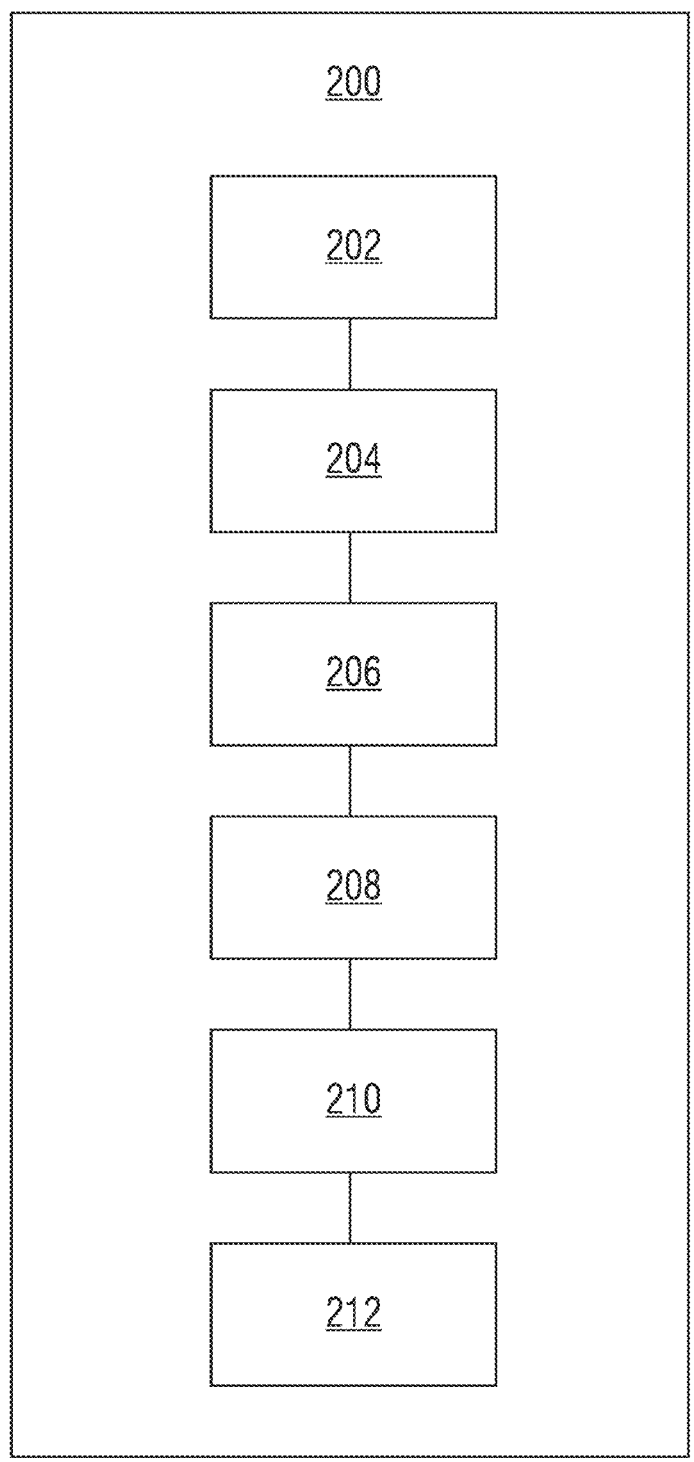
FIG. 2 is a block diagram of an apparatus for evaluating the health state of a distribution transformer according to one embodiment of the present invention.

FIG. 2 is a block diagram of an apparatus 200 for evaluating the health state of a distribution transformer according to one embodiment of the present invention. As shown in FIG. 2, the apparatus 200 for evaluating the health state of a distribution transformer comprises a feature extraction unit 202, a clustering unit 204, a reference determination unit 206, a similarity calculation unit 208 and a sorting unit 210.

The feature extraction unit 202 is configured to extract features from electric power parameters of a plurality of distribution transformers. Preferably, the electric power parameter is a voltage.

The feature extraction unit is further configured to extract the features based on statistical parameters, and to filter the electric power parameters to obtain the filtered features.

The operations of the feature extraction unit 202 are similar to the operations in block S102 that are described above with reference to FIG. 1.

The clustering unit 204 is configured to cluster the plurality of distribution transformers into M subsets based on the extracted features, where M is a natural number greater than 1 and less than the number of the distribution transformers.

The reference determination unit 206 is configured to determine a cluster center of each of the subsets as a reference transformer for the subset.

The similarity calculation unit 208 is configured to calculate the similarity between each of the distribution transformers in each of the subsets and the reference transformer in the subset.

Preferably, the similarity calculation unit 208 calculates the similarity between a distribution transformer and the reference transformer by calculating a cosine distance or a Euclidean distance between an electric power parameter curve of the distribution transformer and an electric power parameter curve of the reference transformer. A person skilled in the art can understand that the method for calculating the similarity between a distribution transformer and a reference transformer is not limited to the above-described cosine distance or Euclidean distance.

The sorting unit 210 is configured to sort the distribution transformers in each of the subsets according to the calculated similarity.

Optionally, the apparatus for evaluating the health state of a distribution transformer may further comprise: a state evaluation unit 212 configured to evaluate the state of each distribution transformer based on the health state of the reference transformer in one subset and the sorting of the distribution transformers therein.

The operations of the reference determination unit 206, the similarity calculation unit 208, the sorting unit 210 and the state evaluation unit 212 are similar to the operations in block S106 that are described above with reference to FIG. 1.

As described above, the embodiments of the method and apparatus for evaluating the health state of a distribution transformer according to the present invention are described with reference to FIGS. 1 and 2. The apparatus 200 for evaluating the health state of a distribution transformer can be implemented in hardware, and may also be implemented in software or a combination of hardware and software.

Figure 3:
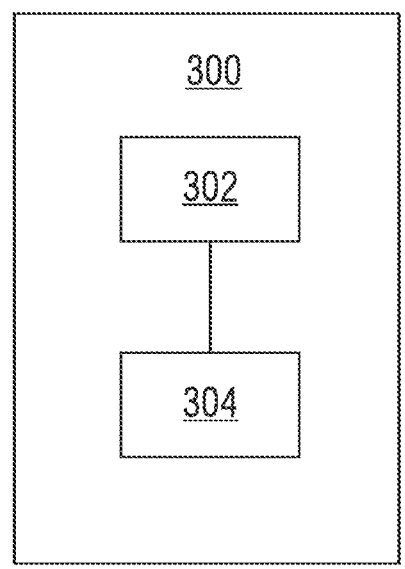
FIG. 3 is a block diagram of an electronic device for evaluating the health state of a distribution transformer according to one embodiment of the present invention.

In the present invention, the apparatus 200 for evaluating the health state of a distribution transformer can be implemented by using an electronic device. FIG. 3 shows a block diagram of an electronic device 300 for evaluating the health state of a distribution transformer according to the present invention. According to one embodiment, the electronic device 300 may comprise at least one processor 302, wherein the processor 302 executes at least one computer readable instruction (namely, the above-mentioned element implemented in the form of software) stored or encoded in a computer readable storage medium (namely, the memory 304).

In one embodiment, the memory 304 stores computer executable instructions that, when executed, cause the at least one processor 302 to: extract features from electric power parameters of a plurality of distribution transformers; cluster the plurality of distribution transformers into M subsets based on the extracted features, where M is a natural number greater than 1 and less than the number of the distribution transformers; and respectively execute the following processing for each of the M subsets: determining a cluster center of the subset as a reference transformer for the subset; calculating the similarity between each of the distribution transformers in the subset and the reference transformer therein; and sorting the distribution transformers in the subset according to the calculated similarity.

It should be understood that the computer executable instruction stored in the memory 304 causes, when executed, the at least one processor 302 to execute various operations and functions described above in combination with FIGS. 1 and 2 in the embodiments of the present invention.

According to one embodiment, a non-transitory machine readable medium is provided. The non-transitory machine readable medium can have a machine executable instruction (namely, the above-mentioned element implemented in the form of software) that, when executed by a machine, causes the machine to execute various operations and functions described above in combination with FIGS. 1 and 2 in the embodiments of the present invention.

According to one embodiment, a computer program is provided, which comprises a computer executable instruction that, when executed, causes at least one processor to execute various operations and functions described above in combination with FIGS. 1 and 2 in the embodiments of the present invention.

According to one embodiment, a computer program product is provided, which comprises a computer executable instruction that, when executed, causes at least one processor to execute various operations and functions described above in combination with FIGS. 1 and 2 in the embodiments of the present invention.

Example embodiments are described above in combination with the specific embodiments described in the drawings, but do not represent all the embodiments that can be implemented or fall within the protection scope of the claims. The term "example" used throughout the description means "used as an example, an instance or an illustration", but does not mean "preferred" or "advantageous" over the other embodiments. For the purpose of providing an understanding of the described technologies, the specific embodiments comprise specific details. However, the technologies can be implemented without the specific details. In some embodiments, in order to avoid making the understanding of the described concepts in the embodiments difficult, commonly known structures and apparatuses are shown in the form of a block diagram.

The descriptions above of the present disclosure are provided to enable any person of ordinary skill in the art to implement or use the present disclosure. For a person of ordinary skill in the art, various modifications made to the present disclosure are obvious. Furthermore, the general principle defined herein can also be applied to other variations without departing from the protection scope of the present disclosure. Therefore, the present disclosure is not limited to the examples and designs described herein, but is to be accorded the widest scope consistent with the principles and novel features disclosed herein.

The invention claimed is:

1. A method for evaluating a health state of a distribution transformer, comprising:
    extracting features from electric power parameters of a plurality of distribution transformers;
    clustering the plurality of distribution transformers into M subsets based on the features extracted, where M is a natural number greater than 1 and less than a number of the plurality of distribution transformers; and
    respectively executing processing for respective subsets of the M subsets including:
    determining a cluster center of a respective subset of the M subsets as a reference transformer for the respective subset;
    calculating a similarity between each of the plurality of the distribution transformers in the respective subset and the reference transformer; and
    sorting the distribution transformers in the respective subset according to the similarity calculated, wherein the processing respectively executed for each of the respective M subsets further comprises:
    evaluating a first health state of each respective distribution transformer based on a second health state of the reference transformer in one respective subset of the M subsets and the sorting of the distribution transformers in the one respective subset of the M subsets.

2. The method of claim 1, wherein the electric power parameters include a voltage.

3. The method of claim 2, wherein the extracting of features from electric power parameters of the plurality of distribution transformers comprises:
    extracting the features based on statistical parameters, and filtering the electric power parameters to obtain filtered features.

4. The method of claim 2, wherein the calculating of the similarity between each of the plurality of the distribution transformers in the respective subset and the reference transformer comprises:
    calculating a cosine distance or a Euclidean distance between an electric power parameter curve of a respective distribution transformer, of the plurality of the distribution transformers, and an electric power parameter curve of the reference transformer.

5. The method of claim 1, wherein the extracting of features from electric power parameters of the plurality of distribution transformers comprises:
    extracting the features based on statistical parameters, and filtering the electric power parameters to obtain filtered features.

6. The method of claim 1, wherein the calculating of the similarity between each of the plurality of the distribution transformers in the respective subset and the reference transformer comprises:
    calculating a cosine distance or a Euclidean distance between an electric power parameter curve of a respective distribution transformer, of the plurality of the distribution transformers, and an electric power parameter curve of the reference transformer.

7. An apparatus for evaluating a health state of a distribution transformer, comprising:
    at least one processor configured to:
    extract features from electric power parameters of a plurality of distribution transformers;
    cluster the plurality of distribution transformers into M subsets based on the features extracted, where M is a natural number greater than 1 and less than a number of the plurality of distribution transformers; and
    respectively execute processing for respective subsets of the M subsets including:
    determining a cluster center of each respective subset of the M subsets as a reference transformer for the respective subset;
    calculating a similarity between each respective distribution transformer of the transformers in each respective subset of the M subsets and the reference transformer in the respective subset; and
    sorting the distribution transformers in each of the respective subsets according to the similarity calculated, wherein processing respectively executed for each of the respective M subsets further comprises:
    evaluating a first health state of each respective distribution transformer based on a second health state of the reference transformer in one respective subset of the M subsets and the sorting of the distribution transformers in the one respective subset of the M subsets.

8. The apparatus of claim 7, wherein the electric power parameters include a voltage.

9. The apparatus of claim 8, wherein the at least one processor is further configured to extract the features based on statistical parameters, and to filter the electric power parameters to obtain the features extracted.

10. The apparatus of claim 8, wherein the at least one processor is further configured to calculate a cosine distance or a Euclidean distance between an electric power parameter curve of a respective distribution transformer, of the plurality of distribution transformers, and an electric power parameter curve of the reference transformer.

11. The apparatus of claim 7, wherein the at least one processor is further configured to extract the features based on statistical parameters, and to filter the electric power parameters to obtain the features extracted.

12. The apparatus of claim 7, wherein the at least one processor is further configured to calculate a cosine distance or a Euclidean distance between an electric power parameter curve of a respective distribution transformer, of the plurality of distribution transformers, and an electric power parameter curve of the reference transformer.

13. An electronic device, comprising:
    at least one processor; and
    a memory coupled to the at least one processor, to store instructions that, when executed by the at least one processor, cause the at least one processor to execute at least:
    extracting features from electric power parameters of a plurality of distribution transformers;
    clustering the plurality of distribution transformers into M subsets based on the features extracted, where M is a natural number greater than 1 and less than a number of the plurality of distribution transformers; and
    respectively executing processing for respective subsets of the M subsets including:
    determining a cluster center of a respective subset of the M subsets as a reference transformer for the respective subset;
    calculating a similarity between each of the plurality of the distribution transformers in the respective subset and the reference transformer; and sorting the distribution transformers in the respective subset according to the similarity calculated, wherein the processing respectively executed for each of the respective M subsets further comprises:

evaluating a first health state of each respective distribution transformer based on a second health state of the reference transformer in one respective subset of the M subsets and the sorting of the distribution transformers in the one respective subset of the M subsets.

14. A non-transitory computer-readable medium stored in a computer readable medium containing a computer program that, when executed, causes at least one processor to execute:

extracting features from electric power parameters of a plurality of distribution transformers;

clustering the plurality of distribution transformers into M subsets based on the features extracted, where M is a natural number greater than 1 and less than a number of the plurality of distribution transformers; and respectively executing processing for respective subsets of the M subsets including:

determining a cluster center of a respective subset of the M subsets as a reference transformer for the respective subset;

calculating a similarity between each of the plurality of the distribution transformers in the respective subset and the reference transformer; and sorting the distribution transformers in the respective subset according to the similarity calculated, wherein the processing respectively executed for each of the respective M subsets further comprises:

evaluating a first health state of each respective distribution transformer based on a second health state of the reference transformer in one respective subset of the M subsets and the sorting of the distribution transformers in the one respective subset of the M subsets.

* * * * *